(12) United States Patent
Jouper

(10) Patent No.: US 10,054,646 B2
(45) Date of Patent: Aug. 21, 2018

(54) HIGH RELIABILITY POWER SUPPLY CONFIGURATION AND TESTING

(71) Applicant: Astronics Advanced Electronic Systems Corp., Kirkland, WA (US)

(72) Inventor: Jeffrey A. Jouper, Newcastle, WA (US)

(73) Assignee: Astronics Advanced Electronic Systems Corp., Kirkland, WA (US)

( * ) Notice: Subject to any disclaimer, the term of this patent is extended or adjusted under 35 U.S.C. 154(b) by 0 days.

(21) Appl. No.: 14/463,541

(22) Filed: Aug. 19, 2014

(65) Prior Publication Data

US 2016/0054394 A1    Feb. 25, 2016

(51) Int. Cl.

| | |
|---|---|
| G06F 11/00 | (2006.01) |
| G01R 31/40 | (2014.01) |
| G01R 19/165 | (2006.01) |
| G01R 31/30 | (2006.01) |
| G06F 1/26 | (2006.01) |
| G11C 5/14 | (2006.01) |
| H02J 1/10 | (2006.01) |
| G01R 31/00 | (2006.01) |
| H02J 9/06 | (2006.01) |
| G11C 29/02 | (2006.01) |
| G11C 29/00 | (2006.01) |

(52) U.S. Cl.
CPC ....... *G01R 31/40* (2013.01); *G01R 19/16538* (2013.01); *G01R 31/008* (2013.01); *G01R 31/30* (2013.01); *G06F 1/263* (2013.01); *G11C 5/147* (2013.01); *G11C 29/021* (2013.01); *G11C 29/702* (2013.01); *H02J 1/10* (2013.01); *H02J 9/06* (2013.01)

(58) Field of Classification Search
CPC ..... G06F 1/30; G06F 11/0754; G06F 11/0757
See application file for complete search history.

(56) References Cited

U.S. PATENT DOCUMENTS

| | | | | |
|---|---|---|---|---|
| 4,528,458 A | * | 7/1985 | Nelson | H02J 1/10 |
| | | | | 307/44 |
| 5,710,701 A | * | 1/1998 | Brown | G01R 31/40 |
| | | | | 324/764.01 |

(Continued)

FOREIGN PATENT DOCUMENTS

| | | |
|---|---|---|
| EP | 0649207 A1 | 4/1995 |
| EP | 0810711 A2 | 4/1997 |

OTHER PUBLICATIONS

EP 15179497.1, Extended European Search Report, dated Jan. 26, 2016.

*Primary Examiner* — Bryce P Bonzo
*Assistant Examiner* — Jonathan D Gibson
(74) *Attorney, Agent, or Firm* — Wiggin and Dana LLP; Gregory S. Rosenblatt; Jonathan D. Hall

(57) ABSTRACT

Disclosed is a power supply system having a minimum of two power supplies that are together configured to supply at least a specified level of power when one of the power supplies is in an offline condition. When in operation, a self-test control circuit causes one of the power supplies to enter an offline condition and a power interruption protection circuit of the offline power supply is tested. While the offline power supply is being tested, the remaining power supplies provide sufficient power to whatever loads may be present.

16 Claims, 2 Drawing Sheets

(56) References Cited

U.S. PATENT DOCUMENTS

| | | | | |
|---|---|---|---|---|
| 6,014,322 A * | 1/2000 | Higashi | H02J 1/102 | 363/65 |
| 7,313,714 B1 * | 12/2007 | Helfinstine | G06F 1/28 | 307/18 |
| 7,948,778 B2 * | 5/2011 | Pfitzer | G01R 31/40 | 363/34 |
| 8,223,518 B2 * | 7/2012 | Luu | H02J 1/102 | 323/272 |
| 8,300,438 B1 * | 10/2012 | Herbert | H02M 1/4216 | 363/124 |
| 9,093,860 B2 * | 7/2015 | Beg | G06F 1/263 | |
| 9,189,040 B2 * | 11/2015 | Phadke | G06F 1/26 | |
| 9,280,167 B2 * | 3/2016 | Tsai | G05F 3/00 | |
| 2002/0188383 A1 * | 12/2002 | Elek | H02M 1/34 | 700/297 |
| 2003/0042798 A1 * | 3/2003 | Chang | H02J 3/38 | 307/64 |
| 2004/0036359 A1 * | 2/2004 | Griffith | H02J 1/102 | 307/43 |
| 2004/0039536 A1 * | 2/2004 | Garnett | G01R 31/40 | 702/58 |
| 2005/0268164 A1 * | 12/2005 | Hara | H02J 7/0029 | 714/14 |
| 2006/0208572 A1 * | 9/2006 | Zansky | G06F 1/30 | 307/66 |
| 2007/0216229 A1 * | 9/2007 | Johnson, Jr. | G06F 1/30 | 307/86 |
| 2008/0055947 A1 * | 3/2008 | Wen | H02M 5/458 | 363/65 |
| 2008/0172578 A1 * | 7/2008 | Tsai | G06F 11/2284 | 714/36 |
| 2008/0320322 A1 * | 12/2008 | Green | G06F 1/26 | 713/340 |
| 2009/0195085 A1 * | 8/2009 | Joseph | H01F 27/402 | 307/151 |
| 2009/0222148 A1 * | 9/2009 | Knotts | G05D 1/0038 | 701/2 |
| 2011/0279939 A1 * | 11/2011 | Kitchener | G06F 1/30 | 361/87 |
| 2012/0110350 A1 * | 5/2012 | Horvath | G06F 1/263 | 713/300 |
| 2013/0069432 A1 * | 3/2013 | Beg | H02J 9/06 | 307/64 |
| 2013/0069434 A1 | 3/2013 | Beg et al. | | |
| 2013/0277036 A1 * | 10/2013 | Gao | F28F 27/00 | 165/254 |
| 2013/0293013 A1 * | 11/2013 | Templeton | G06F 1/266 | 307/64 |
| 2015/0177808 A1 * | 6/2015 | Sarti | G06F 1/30 | 713/300 |

* cited by examiner

HIGH RELIABILITY POWER SUPPLY CONFIGURATION AND TESTING

FIELD OF THE DISCLOSURE

The subject matter of the present disclosure generally relates to power supplies, and more particularly relates to high reliability power supplies and the testing thereof.

BACKGROUND OF THE DISCLOSURE

Power converters and power supplies are typically one of the most failure-prone components of electronic systems. Previously, certain design enhancements were proposed and implemented in attempts to prevent or mitigate the risks of power supply failure.

Still, a number of critical power supply features cannot be tested while the power supply is in operation because by design, these features entail interrupting power flow. Such features include, among others, current limiters, ground fault interruption (GFI) circuits and dynamic load performance.

One method to mitigate the prospects for a power supply failure is to provide a redundant power supply, wherein in the case of failure the redundant supply takes over for the failed power supply. However, such a setup has the disadvantage that the transition between the failed and redundant supplies can create a short interruption of power flow. Furthermore, this methodology does not allow for the testing of protection features that cannot be tested without disrupting the operation of the power supply.

The subject matter of the present disclosure is directed to overcoming, or at least reducing the effects of, one or more of the problems set forth above.

BRIEF SUMMARY OF THE DISCLOSURE

Disclosed is a highly reliable power system having enhanced health monitoring capabilities.

An embodiment system has at least two, but preferably three, power supplies configured to collectively supply power to a load(s). A self-test control circuit tests the power supplies in a cycle by removing one from service and testing those components of the power supply that can only be tested in an offline state, such as GFI protection. While the one power supply is being tested, the other power supplies supply the necessary power to the load(s). When the testing is complete, the tested power supply is returned to service and optionally another of the power supplies can be similarly taken offline and tested, a process which can continue until all of the power supplies are tested.

The embodiment includes the ability to perform self-testing at start-up and also to monitor conditions such as power input and output, temperature, and other attributes. The system may be tested while still in operation without an interruption to service as is common with previous methodologies.

BRIEF DESCRIPTION OF THE DRAWINGS

The foregoing summary, preferred embodiments, and other aspects of the present disclosure will be best understood with reference to a detailed description of specific embodiments, which follows, when read in conjunction with the accompanying drawings, in which.

Like reference numbers and designations in the various drawings indicate like elements.

DETAILED DESCRIPTION

Disclosed is a power supply system and method of operating thereof.

Figure 1:
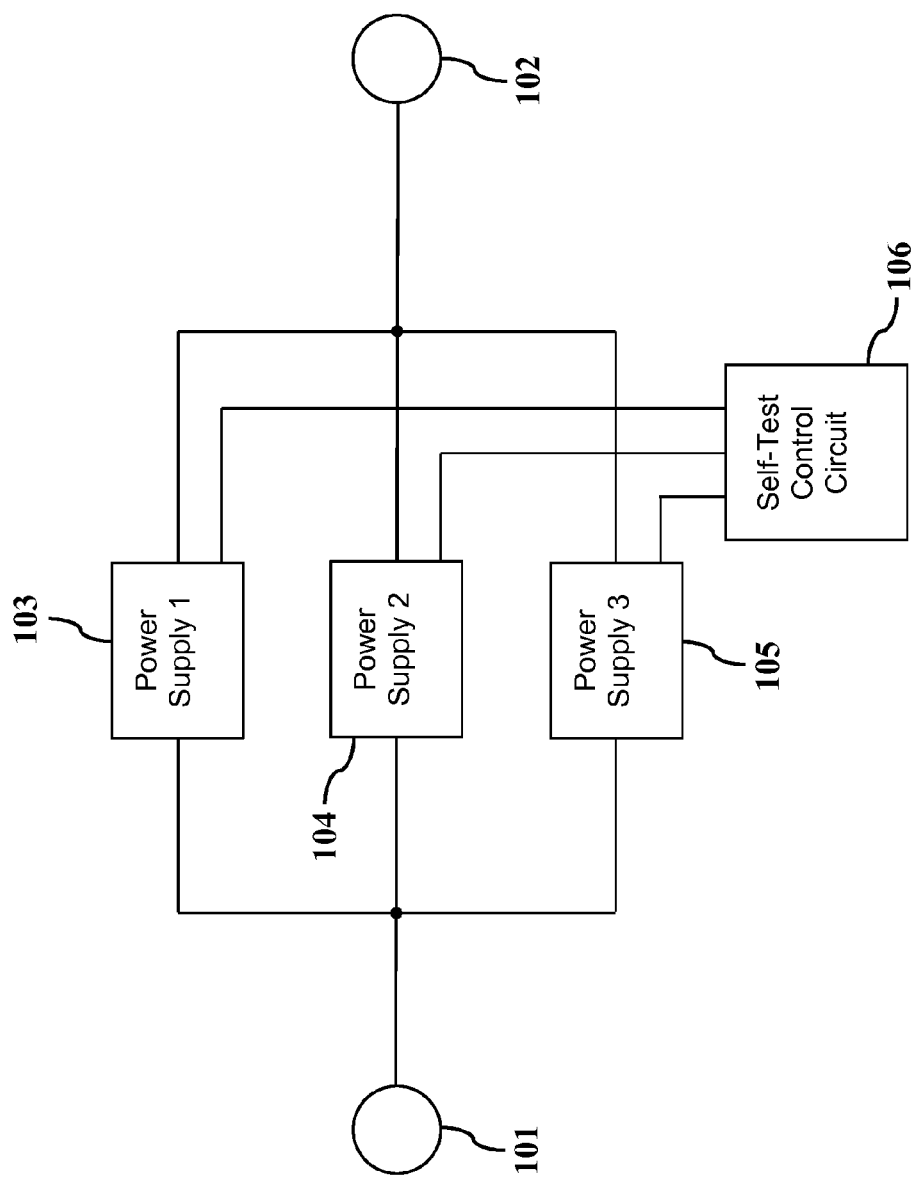
FIG. 1 is a block diagram of an embodiment.

FIG. 1 is a block diagram depiction of embodiment power supply system 100. Power source 101 supplies power to load(s) 102 via power supplies 103, 104 and 105. Self-test control circuit 106 is in electric communication with power supplies 103, 104 and 105. While in a normal online state, power supplies 103, 104 and 105 process power from power source 101 and supply it to load(s) 102. To facilitate the operation of self-test control circuit 106, only two of the three power supplies are needed to meet the maximum loading scenario.

In the embodiment, self-test control circuit 106 is configured to periodically test power supplies 103, 104 and 105 in a cyclical fashion to preemptively identify problems that may threaten the operation of system 100. For instance, at a predetermined interval, self-test control circuit 106 can begin a testing cycle. In such a cycle, self-test control circuit 106 causes power supply 103 to enter an offline state and performs necessary testing of power supply 103, for instance evaluating whether its ground fault interruption circuit is functioning properly. While power supply 103 is offline, power supplies 104 and 105 supply power to load(s) 102. If testing of power supply 103 is complete and indicates that no maintenance is required or no problem is present, power supply 103 is returned to an online state. Once fully operational, the next power supply in the cycle, for instance power supply 104, is similarly taken offline and tested. In turn, once power supply 104 has been returned to an online state, power supply 105 is tested. Once testing of all of the power supplies is complete, self-test control circuit will again wait for the completion of the predetermined interval and then begin testing anew.

It should be understood that various testing schemes may be employed without departing from the disclosed subject matter. For instance, self-test control circuit 106 may test each of the power supplies in a rotation when or shortly after power supply system 100 is first brought online. If power supply system 100 is frequently brought online and offline, it may be sufficient for self-test control circuit 106 to only test one of the power supplies whenever power supply system 100 is brought online.

Depending on desired characteristics, various actions may be taken depending on the type and number of problems detected during testing. For instance, if a non-critical condition is detected in a particular power supply, that power supply may be 'flagged' for maintenance but nonetheless returned to an online state. Such a scheme may help ensure that the power supplies are available whenever possible, so that an unexpected failure of one of the power supplies does not result in the failure of the overall power system. Alternatively, if a critical condition is detected in a particular power supply, such as that GFI protection is not functioning, that power supply can be left in an offline condition, while the remaining power supplies provide power to the load(s). Functionality that may be tested during a test cycle includes aspects such as ground fault interrupter operation and other power interrupting circuits. Flagged conditions may be stored in an non-transient computer readable storage medium and/or alerts can be provided to users, for instance the pilots of an aircraft employing an embodiment.

Figure 2:
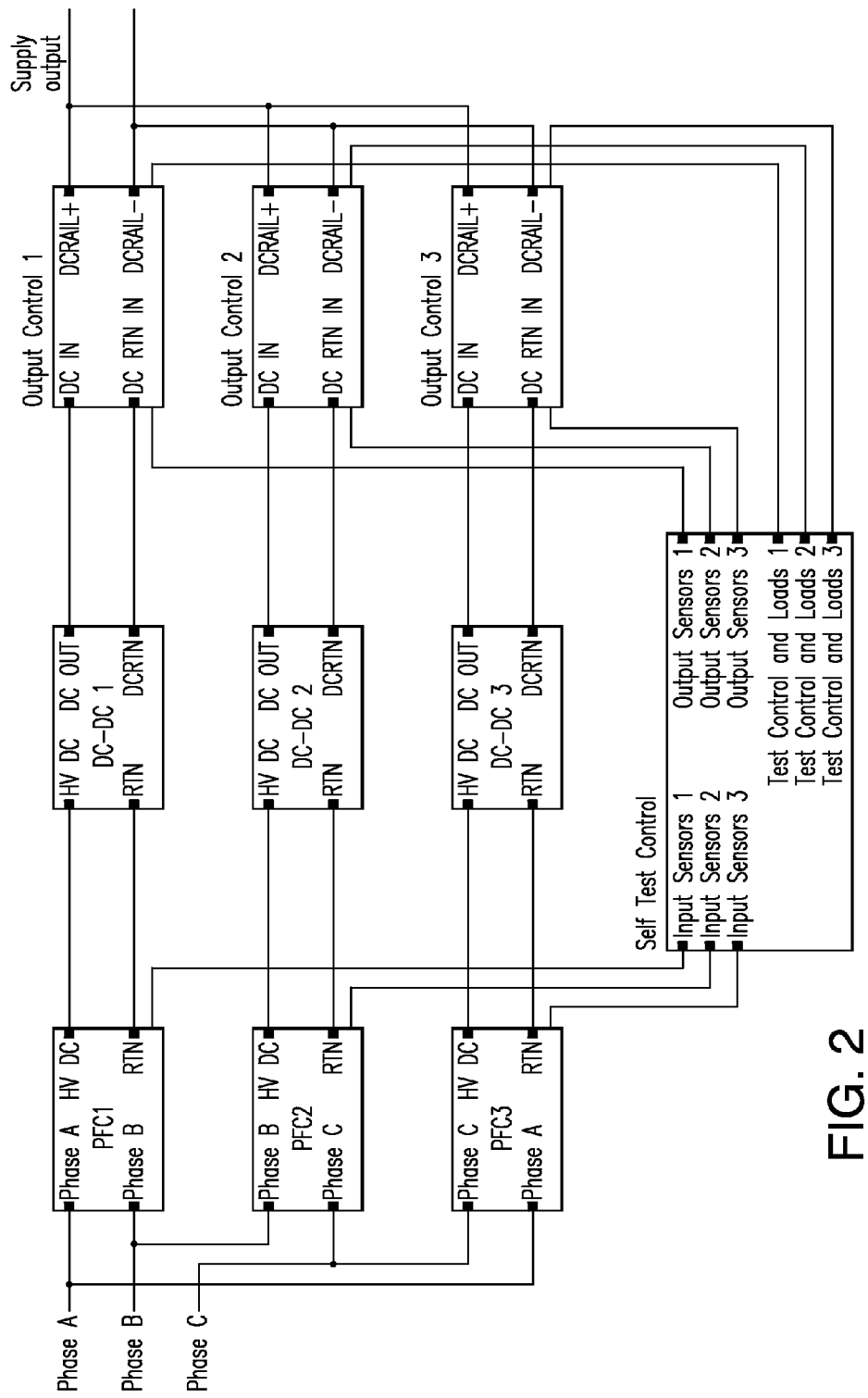
FIG. 2 is a detailed schematic diagram of the embodiment of FIG. 1.

FIG. 2 is a detailed schematic diagram of the embodiment of FIG. 1, illustrating the various connections between the respective components.

Although the disclosed subject matter has been described and illustrated with respect to embodiments thereof, it should be understood by those skilled in the art that features of the disclosed embodiments can be combined, rearranged, etc., to produce additional embodiments within the scope of the invention, and that various other changes, omissions, and additions may be made therein and thereto, without parting from the spirit and scope of the present invention.

What is claimed:

1. A power supply system, comprising:
   a set of power supplies consisting of a first, second and third power supplies disposed on an aircraft, each power supply having a power factor correction (PFC) portion, a DC-DC conversion portion, and a output control portion;
   wherein the PFC portion of the first power supply has a Phase A input configured to receive Phase A of three-phase power having Phase A, Phase B and Phase C, and having a Phase B return;
   wherein the PFC portion of the second power supply has a Phase B input configured to receive Phase B of the three-phase power and having a Phase C return;
   wherein the PFC portion of the third power supply has a Phase C input configured to receive Phase C of the three-phase power and having a Phase A return;
   each of the power supplies being configured in parallel with respect to each of the other power supplies;
   wherein together the power supplies are configured to supply a predetermined amount of power when one of the power supplies is in an offline state and the remaining power supplies are in an online state;
   a self-test control circuit, connected to each of the power supplies individually, configured to, when all of the power supplies are initially in an online state, cause a first one of the power supplies to enter an offline state and test at least one power interrupting function of the first one of the power supplies; and
   wherein the self-test control circuit is configured to return the first one of the parallel power supplies to the online state when testing of the first one of the power supplies is complete and no critical condition is detected or to remain in an offline state if a critical condition is detected; and
   then cyclically test the power interrupting functions of the remaining power supplies.

2. The power supply system of claim 1 the self-test control circuit is configured to flag problematic conditions that it detects when the power supplies are tested.

3. The power supply system of claim 1 wherein the cyclical testing is continuously conducted at a predetermined temporal interval.

4. The power supply system of claim 1 wherein the cyclical testing is conducted when the power supply system is first initiated.

5. The power supply system of claim 1 wherein the self-test control circuit is configured to flag one of the power supplies for future maintenance if the self-test control circuit detects a non-critical condition and is further configured to cause the one of the power supplies to remain in an offline condition if the self-test control circuit detects a critical condition.

6. The power supply system of claim 1 wherein the power interrupting functions include ground fault interruption (GFI) protection.

7. The power supply system of claim 1 wherein the self-test control circuit has three input sensors, one associated with each of the PFC portions of the first, second and third power supplies; and wherein the self-test control circuit has three output sensors, one associated with each of the output control portions of the first, second and third power supplies.

8. The power supply system of claim 7 wherein the Phase B return of the PFC portion of the first power supply is coupled with the Phase B input of the PFC portion of the second power supply, the Phase C return of the PFC portion of the second power supply is coupled with the Phase C input of the PFC portion of the third power supply, and the Phase A return of the PFC portion of the third power supply is coupled with the Phase A input of the PFC portion of the first power supply.

9. A method of testing a power supply system, comprising the steps of:
   providing a set of power supplies consisting of a first, second and third power supplies, disposed on an aircraft, each power supply having a power factor correction (PFC) portion, a DC-DC conversion portion, and a output control portion;
   wherein the PFC portion of the first power supply has a Phase A input configured to receive Phase A of three-phase power having Phase A, Phase B and Phase C, and having a Phase B return;
   wherein the PFC portion of the second power supply has a Phase B input configured to receive Phase B of the three-phase power and having a Phase C return;
   wherein the PFC portion of the third power supply has a Phase C input configured to receive Phase C of the three-phase power and having a Phase A return;
   wherein each power supply is connected in parallel with respect to the other power supplies, wherein together the power supplies are configured to supply a predetermined amount of power to at least one load;
   providing a self-test control circuit connected to each of the power supply individually;
   operating the two power supplies in an online condition to supply power to the at least one load;
   causing through the self-test control circuit a first of the power supplies to enter an offline state;
   testing at least one power interrupting function of the first of the power supplies while the remaining power supplies continue to provide power to the loads;
   returning the first of the power supplies to an online condition if no critical condition is detected during the step of testing or remaining the power supply in an offline state if a critical condition is detected; and
   cyclically testing the power interrupting functions of the remaining power supplies by repeating the steps of causing a power supply to enter an offline condition, testing, and returning the power supply to an online condition.

10. The method of claim 9, further comprising the steps of:
    flagging any critical or non-critical conditions for maintenance.

11. The method of claim 9 wherein testing is stopped if a critical condition is detected in any of the power supplies that are tested.

12. The method of claim 9 wherein the self-test control circuit has three input sensors, one associated with each of the PFC portions of the first, second and third power supplies; and wherein the self-test control circuit has three output sensors, one associated with each of the output control portions of the first, second and third power supplies.

13. The power supply system of claim 9 wherein the power interrupting protection functions include GFI protection.

14. The method of claim 9, wherein the cyclical testing is repeated after a predetermined temporal interval.

15. The method of claim 9, wherein the cyclical testing is performed when the power supply system is first initiated.

16. The power supply system of claim 9 wherein the Phase B return of the PFC portion of the first power supply is coupled with the Phase B input of the PFC portion of the second power supply, the Phase C return of the PFC portion of the second power supply is coupled with the Phase C input of the PFC portion of the third power supply, and the Phase A return of the PFC portion of the third power supply is coupled with the Phase A input of the PFC portion of the first power supply.

\* \* \* \* \*